US012628316B2

(12) United States Patent
Shi et al.

(10) Patent No.: US 12,628,316 B2
(45) Date of Patent: May 12, 2026

(54) ELECTRICAL CONNECTOR HAVING BENDING EXTENSION PART AT TERMINALS

(71) Applicant: Delta Electronics, Inc., Taoyuan City (TW)

(72) Inventors: Jing-Xian Shi, Taoyuan City (TW); Nien-Wei Tung, Taoyuan City (TW)

(73) Assignee: Delta Electronics, Inc., Taoyuan City (TW)

( * ) Notice: Subject to any disclaimer, the term of this patent is extended or adjusted under 35 U.S.C. 154(b) by 315 days.

(21) Appl. No.: 18/243,867

(22) Filed: Sep. 8, 2023

(65) Prior Publication Data

US 2024/0422948 A1      Dec. 19, 2024

(30) Foreign Application Priority Data

Jun. 14, 2023    (CN) .......................... 202310704385.9

(51) Int. Cl.
*H05K 7/20*         (2006.01)
*H01R 13/04*        (2006.01)

(52) U.S. Cl.
CPC ......... *H05K 7/20445* (2013.01); *H01R 13/04* (2013.01); *H05K 7/20509* (2013.01); *H01R 2201/06* (2013.01)

(58) Field of Classification Search
CPC .................................................... H01R 13/652
USPC ....................................... 439/108, 101, 487
See application file for complete search history.

(56) References Cited

U.S. PATENT DOCUMENTS

| | | | | |
|---|---|---|---|---|
| 4,487,464 | A | * 12/1984 | Kirschenbaum | ..... H01R 31/085 |
| | | | | 439/62 |
| 6,217,347 | B1 | * 4/2001 | Schell | .................. H01R 12/722 |
| | | | | 439/79 |
| 9,437,988 | B2 | * 9/2016 | McGrath | ................ H01R 24/60 |
| 9,537,261 | B2 | 1/2017 | Chen et al. | |
| 10,170,845 | B2 | 1/2019 | Ju | |
| 11,228,137 | B2 | 1/2022 | Xu et al. | |
| 11,495,926 | B2 | 11/2022 | Chang et al. | |
| 2013/0095673 | A1 | 4/2013 | Brandon et al. | |
| 2017/0070015 | A1 | 3/2017 | Chen et al. | |
| 2017/0133781 | A1 | 5/2017 | Duan et al. | |
| 2020/0014158 | A1 | 1/2020 | Chien et al. | |
| 2020/0358210 | A1 | 11/2020 | Bogen et al. | |

(Continued)

FOREIGN PATENT DOCUMENTS

| | | |
|---|---|---|
| CN | 107039807 A | 8/2017 |
| CN | 208539159 U | 2/2019 |

(Continued)

*Primary Examiner* — Phuong K Dinh
(74) *Attorney, Agent, or Firm* — KIRTON McCONKIE; Evan R. Witt

(57)               ABSTRACT

An electric connector includes a casing, a plurality of ground terminals, a first connection portion, a plurality of electrical terminals and a second connection portion. The casing has an accommodating space. The plurality of ground terminals and the plurality of electrical terminals are arranged in the accommodating space. The first connection portion connects to the plurality of ground terminals and is bent and extended to form a first extension part. The second connection portion connects to the plurality of electrical terminals and extends a second extension part. One of the first extension part and the second extension part is a plate structure with bent steps.

9 Claims, 9 Drawing Sheets

(56) References Cited

U.S. PATENT DOCUMENTS

| | | | |
|---|---|---|---|
| 2021/0091500 | A1 | 3/2021 | Chang et al. |
| 2021/0091523 | A1 | 3/2021 | Chang et al. |
| 2024/0356274 | A1 | 10/2024 | Wang et al. |
| 2024/0364061 | A1 | 10/2024 | Wang et al. |

FOREIGN PATENT DOCUMENTS

| | | |
|---|---|---|
| CN | 208723144 U | 4/2019 |
| CN | 110729583 B | 8/2021 |
| CN | 215221073 U | 12/2021 |
| CN | 111987506 B | 2/2022 |
| CN | 217468879 U | 9/2022 |
| KR | 20100070954 A | 6/2010 |
| TW | 201405951 A | 2/2014 |
| TW | I469730 B | 1/2015 |
| TW | M506400 U | 8/2015 |
| TW | 201705631 A | 2/2017 |
| TW | M542261 U | 5/2017 |
| TW | M554235 U | 1/2018 |

* cited by examiner

1

10

100

11

12

ELECTRICAL CONNECTOR HAVING BENDING EXTENSION PART AT TERMINALS

CROSS-REFERENCE TO RELATED APPLICATION

This application claims priority to China Patent Application No. 202310704385.9, filed on Jun. 14, 2023. The entire contents of the above-mentioned application are incorporated herein by reference for all purposes.

FIELD OF THE INVENTION

The present disclosure relates to an electric connector, and more particularly to an electric connector having bending extension part at the rear end of terminals to enhance heat dissipation.

BACKGROUND OF THE INVENTION

Electric connectors are widely used in electronic equipment in newly days as an interface for power and signal transmission. However, with rapid development of technology, in order to respond to different kinds, types, or brands of electronic equipment, electric connectors of various types and specifications are flourished. For example, the most commonly used connection interface by public is the Universal Serial Bus (USB) connector assembly. Users can plug some peripheral devices with USB male plugs, such as mice, external hard disks, mobile power supplies, etc., into the electronic devices with USB female sockets, so as to achieve electrical connection between the peripheral devices and the electronic device to transmit power and signals, and the peripheral devices can play various functions respectively.

With the increase demand in transmission amounts, transmission rate, and performance requirements, the high-speed TYPE-C specification electric connector assembly of USB is introduced. The USB TYPE-C electric connector assembly has smaller size than the traditional USB interfaces, but can support higher power charging and power supply capability, and faster in transmission speed. In addition, it can support front and back plugging, so that users no longer need to distinguish the front and back side, and it is more suitable for using in modern electronic devices that pursue thinness and lightness.

Please refer to FIG. 1A and FIG. 1B. FIG. 1A is a schematic exploded view perspective view illustrating a male electric connector of the prior art. FIG. 1B is a schematic exploded view perspective view illustrating a ground terminal assembly and an electrical terminal assembly of the prior art male electric connector of FIG. 1A. As shown in FIG. 1A, the prior art male electric connector 1 includes a casing 10, a ground terminal assembly 11 and an electrical terminal assembly 12, wherein the casing 10 has an accommodating space 100, and the ground terminal assembly 11 and the electrical terminal assembly 12 are arranged in the accommodating space 100 of the casing 10. As shown in FIG. 1B, the ground terminal assembly 11 has a free end 11a and a rear end 11b, the free end 11a is for coupling with a corresponding contact terminal (not shown), and the rear end 11b is disposed on the opposite end of the free end 11a. In the prior art, the rear end usually has an extension part 11c for welding, so its area is usually slightly smaller. Similarly, the electrical terminal assembly 12 also has a free end 12a and a rear end 12b, and the rear end 12b also has an extension part 12c for welding, and its area is also smaller. Consequently, in the prior art, the ground terminal assembly 11 and the electrical terminal assembly 12 of the conventional male electrical connector 1 cannot effectively use the space at the rear ends 11b, 12b. Moreover, due to the small areas of the extension parts 11c, 12c, the heat dissipation area is limited, and the temperature rise during charging cannot be effectively reduced, result in difficult to increase the rated current value.

Therefore, there is a need of providing an electric connector to obviate the drawbacks encountered from the prior arts.

SUMMARY OF THE INVENTION

It is an object of the present disclosure to provide an electric connector, especially a USB TYPE-C electric connector assembly for charging. The electric connector includes a casing, a plurality of ground terminals, a first connection portion, a plurality of electrical terminals and a second connection portion, wherein the first connection portion connects to the plurality of ground terminals and is bent and extended to form a first extension part, and the second connection portion connects to the plurality of electrical terminals and extends a second extension part. One of the first extension part and the second extension part is a plate structure with bent steps. By the enlarge area and the arrangement of the plate structure with bent steps of the first extension part and the second extension part, the heat conduction area is enlarged, so as to increase the heat dissipation area, reduce the temperature rise during charging and increase the rated current value, and the charging current value and charging performance can be improved.

It is another object of the present disclosure to provide an electric connector, especially a USB TYPE-C electric connector for charging. The electric connector includes a casing, a plurality of ground terminals, a first connection portion, a plurality of electrical terminals and a second connection portion, wherein the first connection portion connects to the plurality of ground terminals and is bent and extended to form a first extension part, and the second connection portion connects to the plurality of electrical terminals and extends a second extension part. Through the arrangement of the plate structure with bent steps of the first extension part and the second extension part, the idle space inside the electrical connector can be effectively utilized.

In accordance with an aspect of the present disclosure, there is provided an electric connector including a casing, a plurality of ground terminals, a first connection portion, a plurality of electrical terminals and a second connection portion. The casing has an accommodating space. The plurality of ground terminals and the plurality of electrical terminals are arranged in the accommodating space. The first connection portion connects to the plurality of ground terminals and is bent and extended to form a first extension part. The second connection portion connects to the plurality of electrical terminals and extends a second extension part. One of the first extension part and the second extension part is a plate structure with bent steps.

In an embodiment, each the ground terminal and each the electrical terminal have free ends and rear ends, the first connection portion couples with the rear ends of the plurality of ground terminals, and the second connection portion couples with the rear ends of the plurality of electrical terminals.

In an embodiment, a width of the plate structure with bent steps is greater than ½ of width of the casing.

In an embodiment, the first extension part has a first vertical projection, the second extension part has a second vertical projection, the first vertical projection partially overlaps with the second vertical projection and defines an overlapping projection length.

In an embodiment, the length of the overlapping projection length is between ¼ and ⅔ of width of the casing.

In an embodiment, a distance is defined between the first extension part or the second extension part and a top surface of the housing.

In an embodiment, a height difference is defined between the first extension part and the second extension part.

In an embodiment, one of the first extension part and the second extension part is the plate structure with bent steps, and the other second extension part or the first extension part comprises a first plate and a second plate.

In an embodiment, one of the first extension part and the second extension part is the plate structure with bent steps and comprises a third plate.

In an embodiment, one of the first extension part and the second extension part is an L-shaped plate structure.

The above contents of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1A:
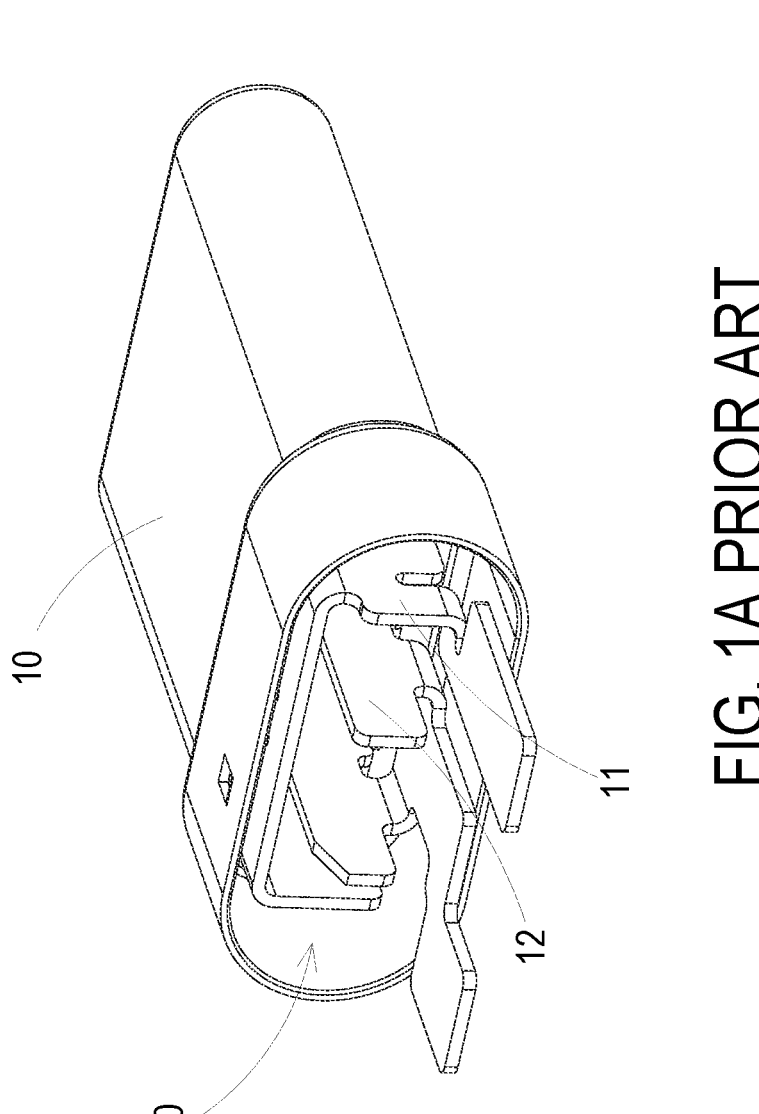
FIG. 1A is a schematic exploded view perspective view illustrating a male electric connector of the prior art.
Figure 1B:
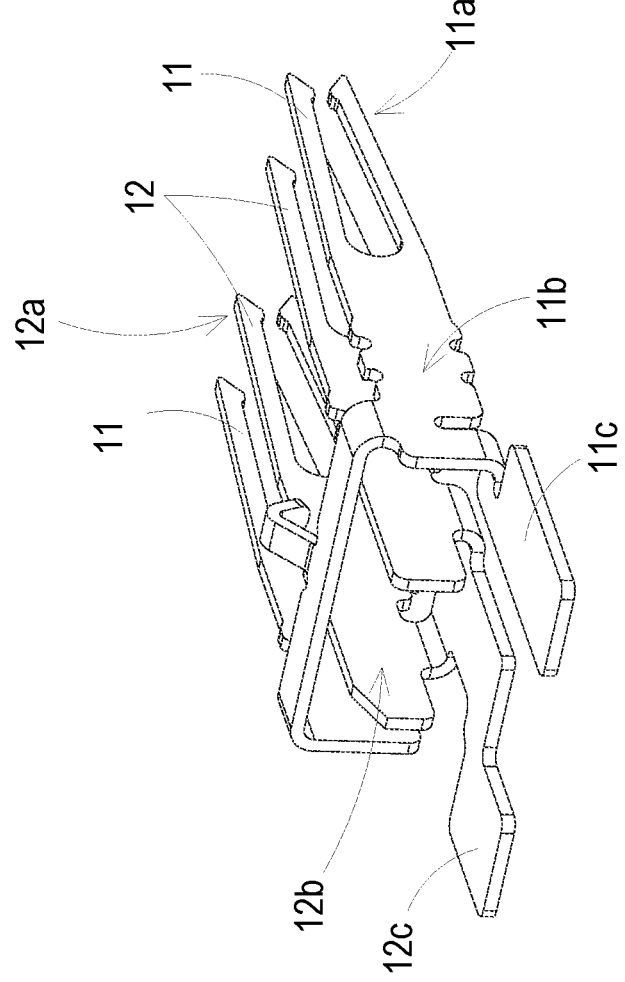
FIG. 1B is a schematic exploded view perspective view illustrating a ground terminal assembly and an electrical terminal assembly of the prior art male electric connector of FIG. 1A.
Figure 2A:
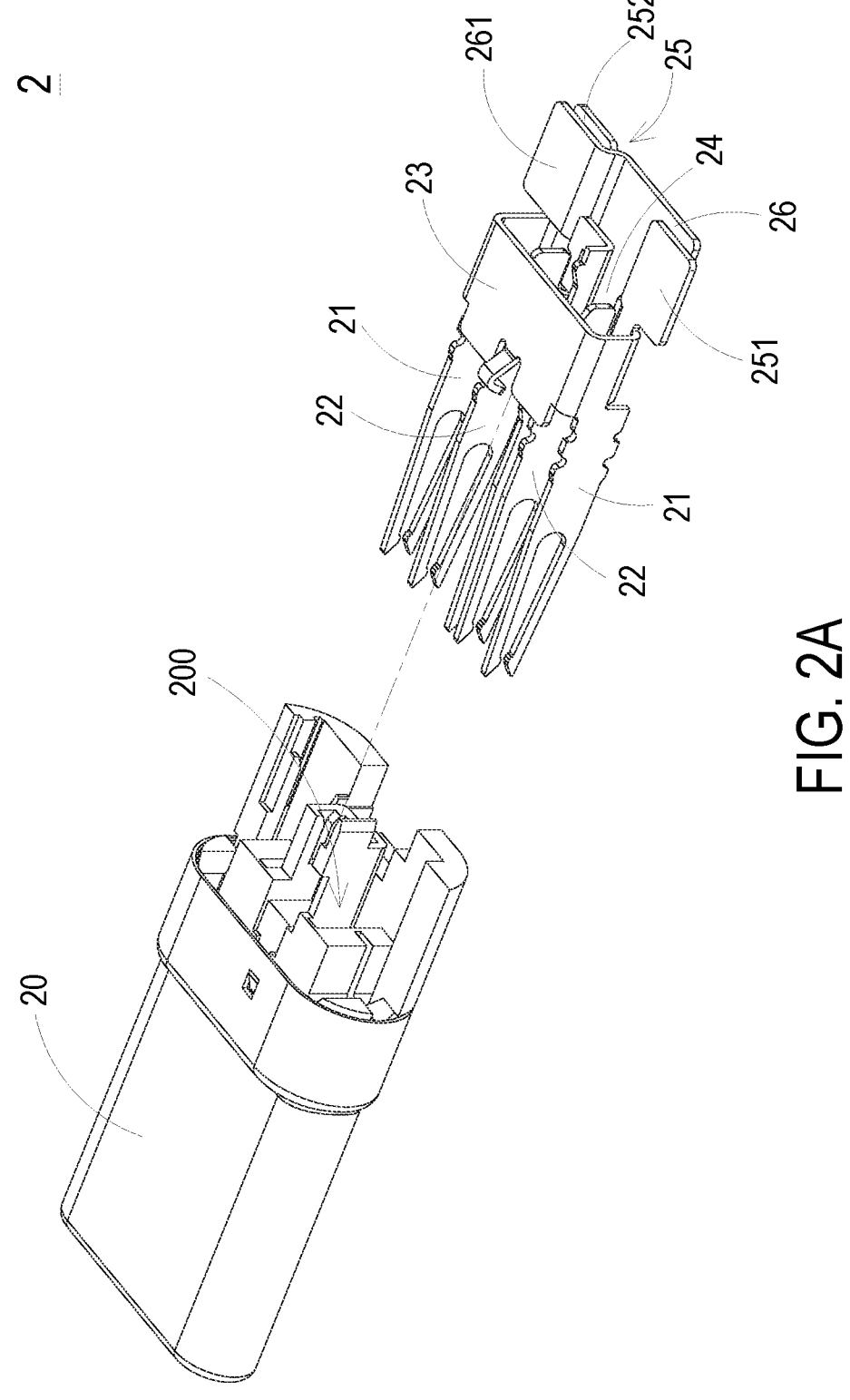
FIG. 2A is a schematic perspective view illustrating ground terminals and electrical terminals assembled with a casing of an electric connector according to a first embodiment of the present disclosure.
Figure 2B:
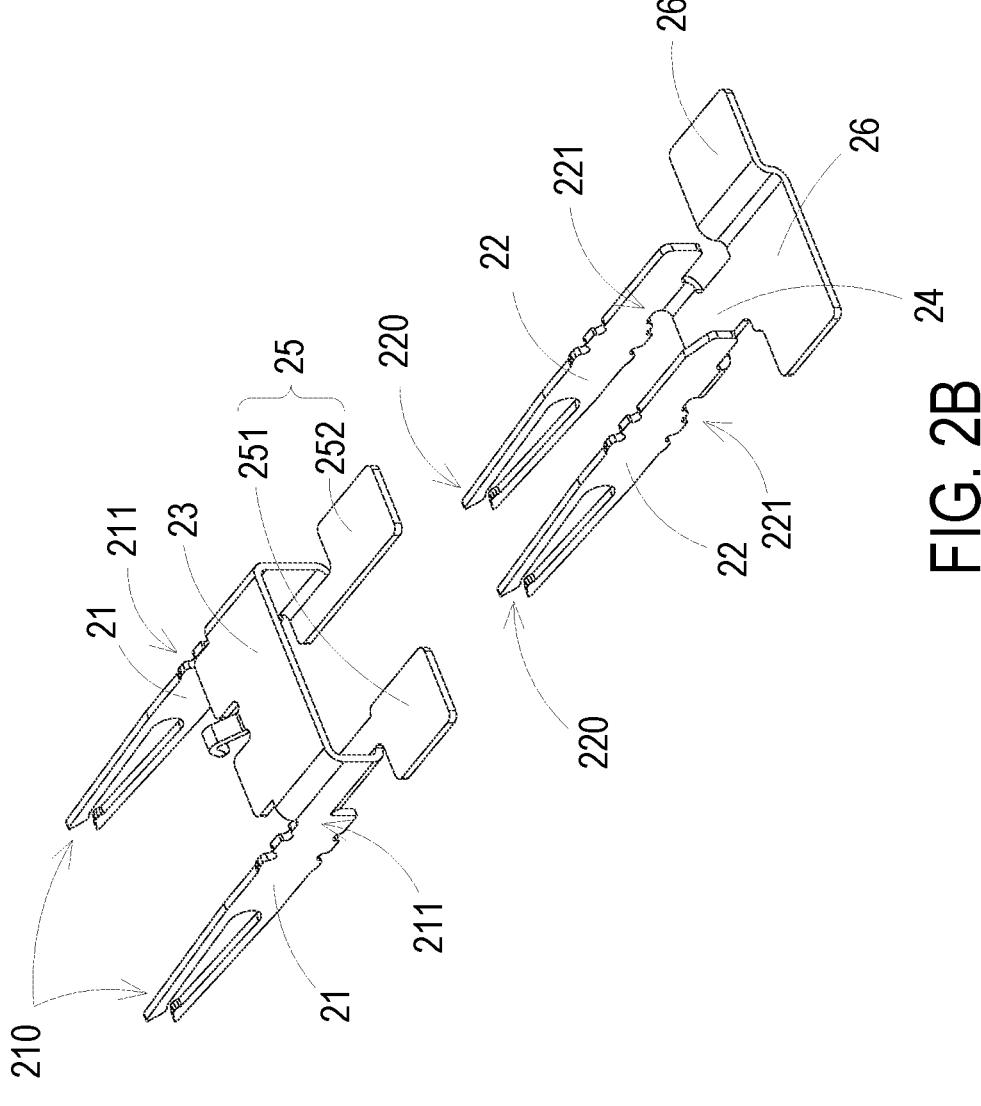
FIG. 2B is a schematic exploded view illustrating the ground terminals and the electrical terminals of FIG. 2A.

FIG. 2A is a schematic perspective view illustrating ground terminals and electrical terminals assembled with a casing of an electric connector according to a first embodiment of the present disclosure. FIG. 2B is a schematic exploded view illustrating the ground terminals and the electrical terminals of FIG. 2A. In this embodiment, the electric connector 2 is a Universal Serial Bus (USB) connector, especially is a USB TYPE-C electric connector for charging. As shown in FIG. 2A, the electric connector 2 is a male electric connector and includes a casing 20, a plurality of ground terminals 21, a plurality of electrical terminals 22, a first connection portion 23 and a second connection portion 24. The casing 20 has an accommodating space 200. The plurality of ground terminals 21 and the plurality of electrical terminals 22 are arranged in the accommodating space 200 of the casing 20. The first connection portion 23 connects to the plurality of ground terminals 21 and is bent and extended to form a first extension part 25. The second connection portion 24 connects to the plurality of electrical terminals 22 and extends a second extension part 26. In the embodiment, one of the first extension part 25 and the second extension part 26 is a plate structure with bent steps. In some embodiments, the plurality of ground terminals 21, the plurality of electrical terminals 22, the first connection portion 23, the second connection portion 24, the first extension part 25 and the second extension part 26 are made of metal material, but not limited thereto.

Please refer to FIG. 2B. As shown in FIG. 2B, each ground terminal 21 has a free end 210 and a rear end 211, the free end 210 is for coupling with a contact terminal (not shown) disposed inside another female electric connector (not shown), and the rear end 211 is disposed on the opposite end of the free end 210 for coupling with the first connection portion 23. In this embodiment, the number of the plurality of ground terminals 21 is two, but not limited thereto. The first connection portion 23 is a plate structure coupling with the two rear ends 211 of the two ground terminals 21. Moreover, the first connection portion 23 is bent downward and extended out to form the first extension part 25. In the embodiment, the first extension part 25 comprises a first plate 251 and a second plate 252, which are respectively formed by extending downward and bending from the two sides of the first connection portion 23. In some embodiment, the first plate 251 and the second plate 252 are parallel to the first connection portion 23, but not limited thereto. Consequently, the first plate 251 can be used as a welding surface. Besides, through the enlarged area of the first plate 251 and the second plate 252, the heat conduction area can be increased, so as to reach the effects of quickly dissipated heat and effectively reducing temperature rise.

Similarly, in the embodiment, the number of the plurality of electrical terminals 22 is two, but not limited thereto. Each electrical terminal 22 has a free end 220 and a rear end 221, the free end 220 is for coupling with a contact terminal (not shown) disposed inside another female electric connector (not shown), and the rear end 221 is disposed on the opposite end of the free end 220 for coupling with the second connection portion 24. As shown in FIG. 2B, the second connection portion 24 is a plate structure coupling with the two rear ends 221 of the two electrical terminals 22. The second connection portion 24 further extends rearward to form the second extension part 26. In this embodiment, the second extension part 26 is a plate structure with bent steps, which has a relatively large width, and is bent upward on one side to form a taller third plate 261. The third plate is parallel to the second connection portion 24 and the second extension part 26, but not limited thereto. Compared with the conventional technology, the area of the second extension part 26 is larger, and by bending and extending the third plate 261, the idle space inside the electrical connector 2 can be effectively utilized to increase heat dissipation area, which is beneficial to reduce the temperature rise and increase the rated current value.

Figure 3:
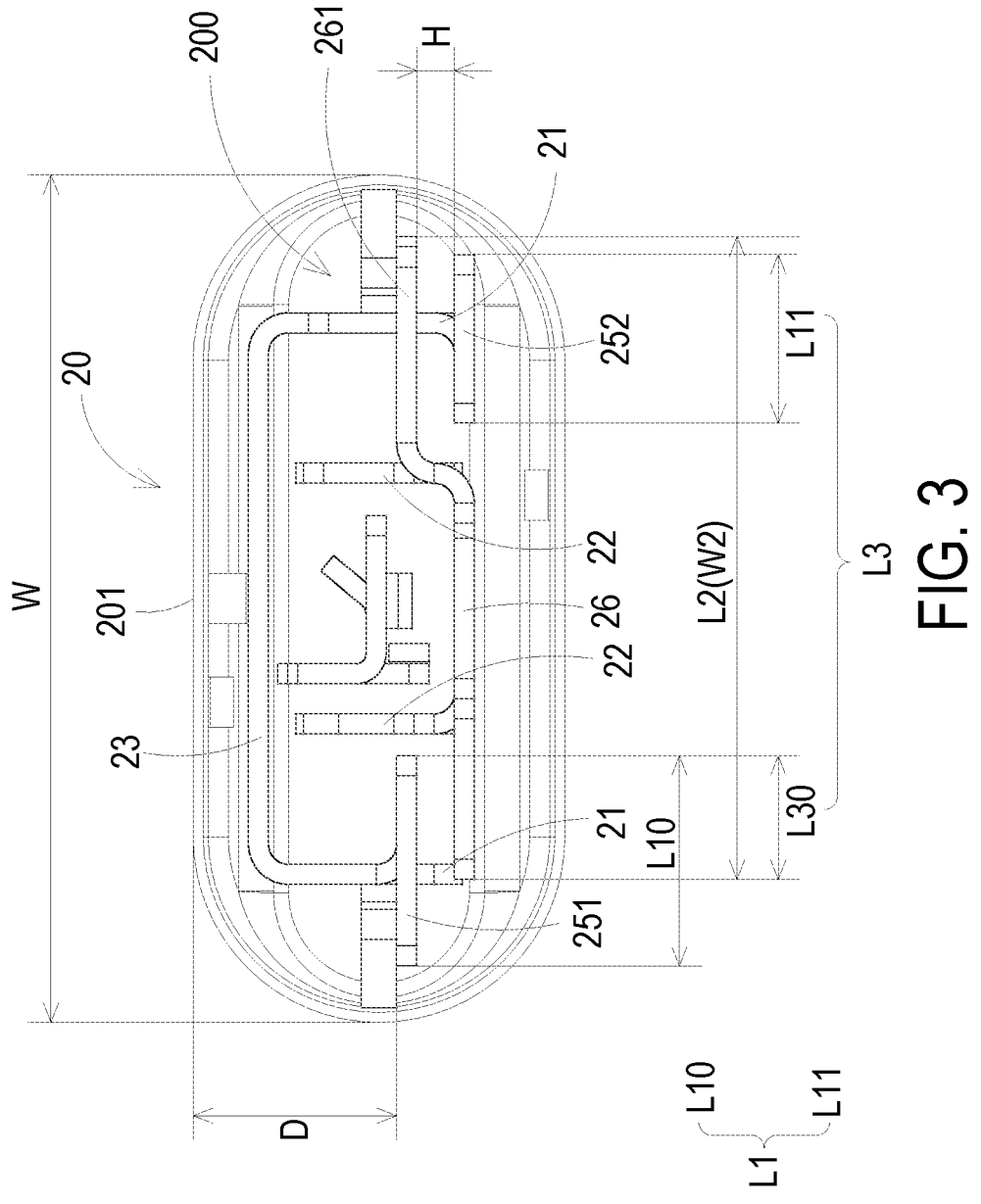
FIG. 3 is a schematic cross-sectional view illustrating the electric connector according to the first embodiment of the present disclosure.

Please refer to FIG. 3. FIG. 3 is a schematic cross-sectional view illustrating the electric connector according to the first embodiment of the present disclosure. As shown in FIG. 3, the plurality of ground terminals 21 and the plurality of electrical terminals 22 are arranged in the accommodating space 200 of the casing 20. As mentioned above, the two sides of the first connection portion 23 coupling with the plurality of ground terminals 21 are bent downward and extended to form the first plate 251 and the second plate 252 of the first extension part 25. In the embodiment, the first plate 251 can be used as a welding surface, thereby a distance D is defined between the first plate 251 and a top surface 201 of the housing 20, so as to maintain a welding distance. In some embodiments, the distance D can be but not limited to be less than 1.8 mm. Besides, the second connection portion 24 coupling with the plurality of the plurality of electrical terminals 22 also extends to form the second extension part 26, which is bent upward on one side to form a taller third plate 261. As shown in FIG. 3, the third plate 261 of the second extension part 26 is taller than the second plate 252 of the first extension part 25. Namely, a height difference H is defined between the third plate 261 of the second extension part 26 and the second plate 252 of the first extension part 25. In some embodiments, the height difference H can be but not limited to be less than 0.4 mm. Consequently, the height difference H is used to maintain a safe distance between the first extension part 25 and the second extension part 26, avoid flashover, and is beneficial to the subsequent procedures such as glue filling and assembly processes. In other embodiments, the plate structure with bent steps of the second extension part 26 has a width W2, and the width W2 is greater than ½ of the width W of the casing 20, but not limited thereto.

Please refer to FIG. 3 again. As shown in FIG. 3, the first extension part 25 has a first vertical projection, due to the first extension part 25 of the first embodiment is composed of the first plate 251 and the second plate 252, the length L1 of the first vertical projection is the length L10 of the first plate 251 plus the length L11 of the second plate 252. Similarly, the second extension part 26 also has a second vertical projection, since the second extension part 26 is the plate structure with bent steps, the length L2 of the second vertical projection is same as the width W2 of the plate structure with bent steps, but not limited thereto. In other embodiments, the length L1 of the first vertical projection and the length L2 of the second vertical projection are varied according to the different appearance of the first extension part 25 and the second extension part 26. As shown in FIG. 3, the first vertical projection of the first extension part 25 partially overlaps with the second vertical projection of the second extension part 26, and an overlapping projection length L3 is defined accordingly. In the embodiment, due to the second vertical projection of the second extension part 26 only covers the partial first plate 251 and the whole second plate 252 of the first extension part 25, the length of the overlapping projection length L3 is the overlapping length L30 of the first plate 251 and the second extension part 26 plus the length L11 of the second plate 252. In some embodiments, the length of the overlapping projection length L3 is between ¼ and ⅔ of the width W of the casing 20, but not limited thereto.

Figure 4A:
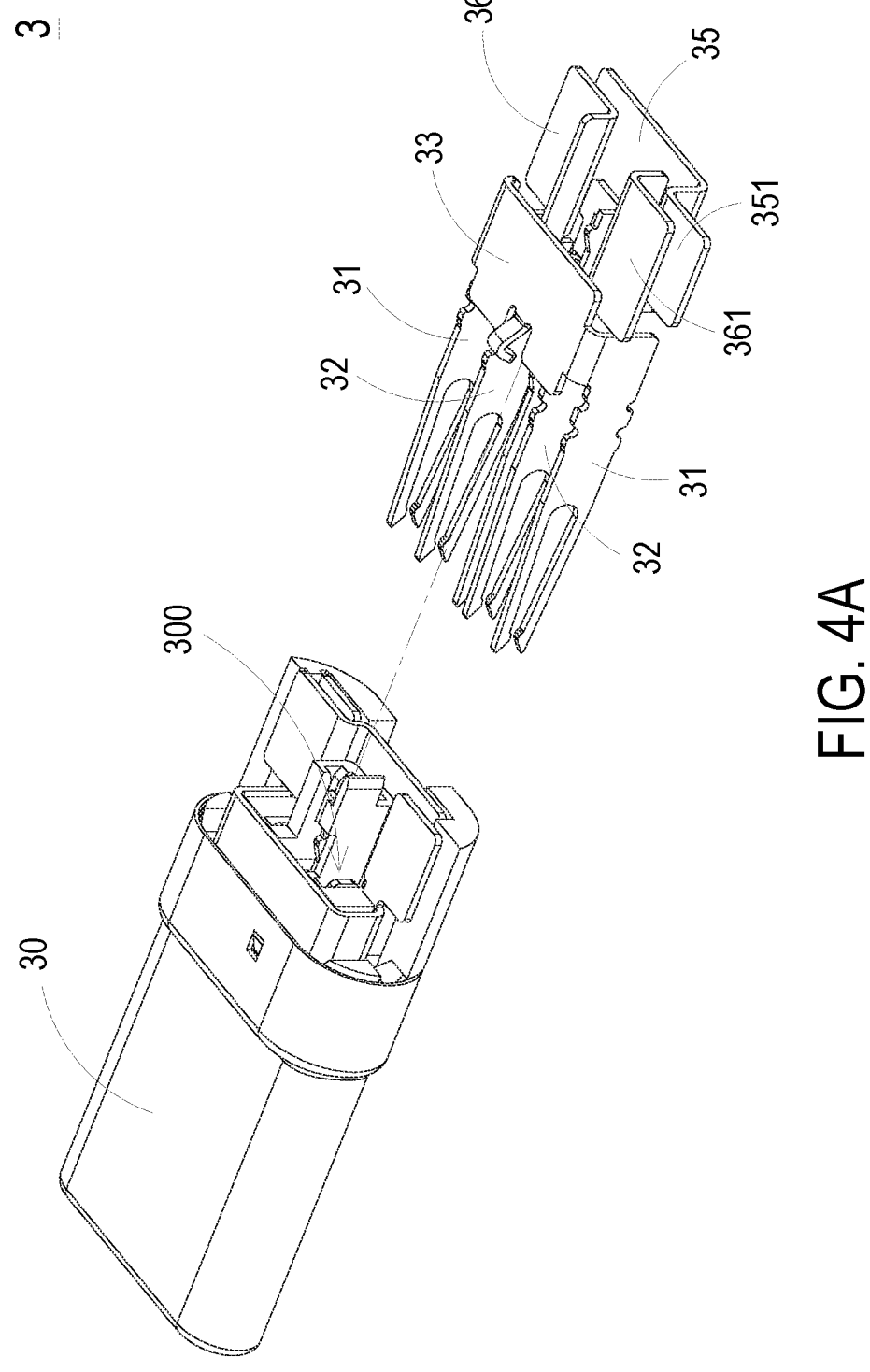
FIG. 4A is a schematic perspective view illustrating ground terminals and electrical terminals assembled with a casing of an electric connector according to a second embodiment of the present disclosure.
Figure 4B:
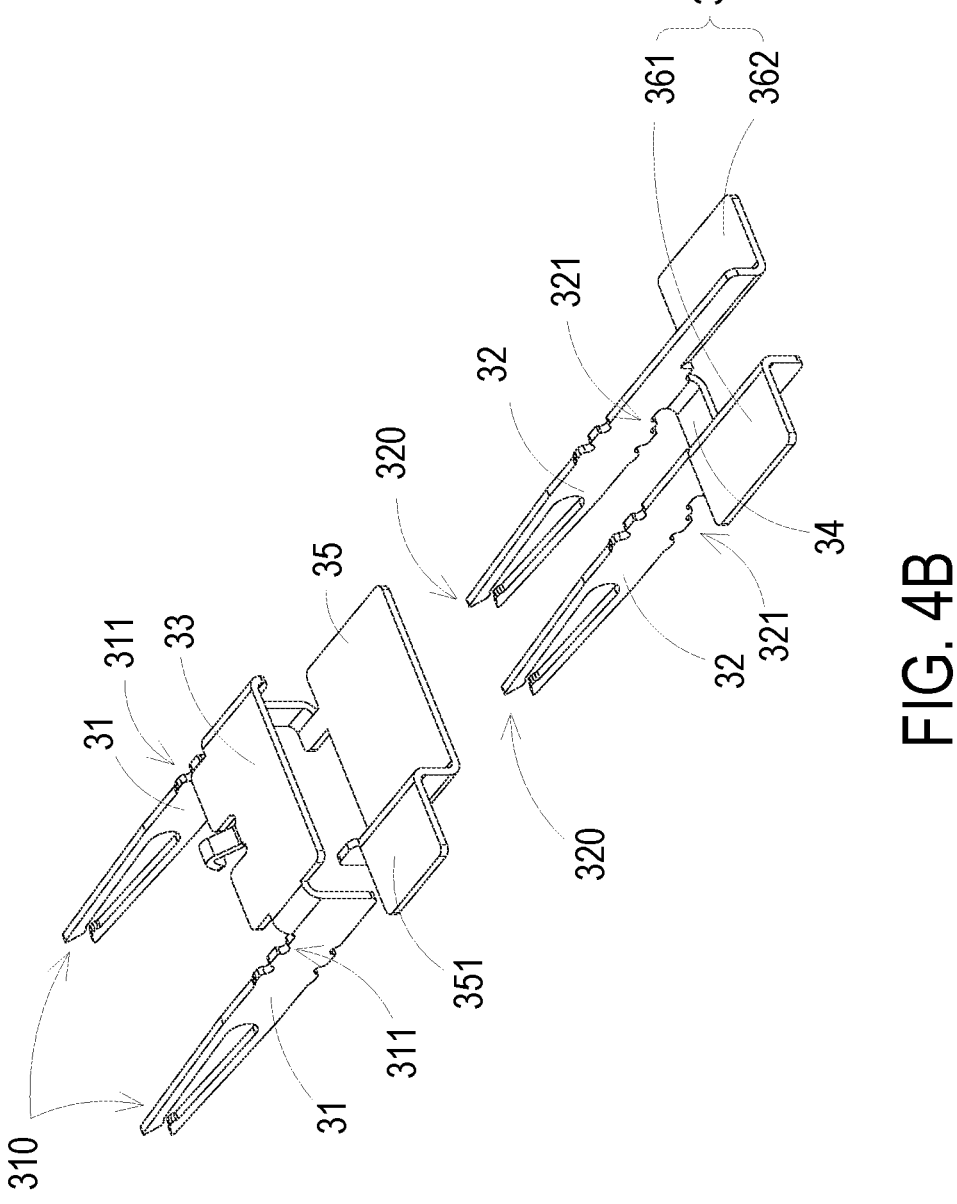
FIG. 4B is a schematic exploded view illustrating the ground terminals and the electrical terminals of FIG. 4A.

Please refer to FIG. 4A and FIG. 4B. FIG. 4A is a schematic perspective view illustrating ground terminals and electrical terminals assembled with a casing of an electric connector according to a second embodiment of the present disclosure. FIG. 4B is a schematic exploded view illustrating the ground terminals and the electrical terminals of FIG. 4A. As shown in FIG. 4A and FIG. 4B, the electric connector 3 of this embodiment also includes a casing 30, a plurality of ground terminals 31, a plurality of electrical terminals 32, a first connection portion 33 and a second connection portion 34, and the plurality of ground terminals 31 and the plurality of electrical terminals 32 are both arranged in the accommodating space 300 of the casing 30. Similar to the previous embodiment, each ground terminal 31 has a free end 310 and a rear end 311, and the first connection portion 33 connects to the rear ends 311 of the plurality of ground terminals 31 and is bent and extended to form a first extension part 35. Each electrical terminal 32 also has a free end 320 and a rear end 321, and the second connection portion 34 connects to the rear ends 321 of the plurality of electrical terminals 32 and extends to form a second extension part 36. While in this embodiment, the structures of the first extension part 35 and the second extension part 36 are different from the previous embodiment. As shown in FIG. 4B, the first extension part 35 is a plate structure with bent steps, which is bent downward from one side of the first connection portion 33, and has a relatively large width. In this embodiment, one side of the first extension part 35 is bent upward to form a taller third plate 351, the third plate 351 is parallel to the first connection portion 33 and the first extension part 35, but not limited thereto. Moreover, the second extension part 36 comprises a first plate 361 and a second plate 362, which are parallel to the second connection portion 34, but not limited thereto. Consequently, by the arrangement of the plate structure with bent steps of the first extension part 35 and the second extension part 36 composed of the first plate 361 and the second plate 362, the idle space inside the electrical connector 3 can be effectively utilized to increase heat dissipation area, which is beneficial to reduce the temperature rise and increase the rated current value.

Figure 5A:
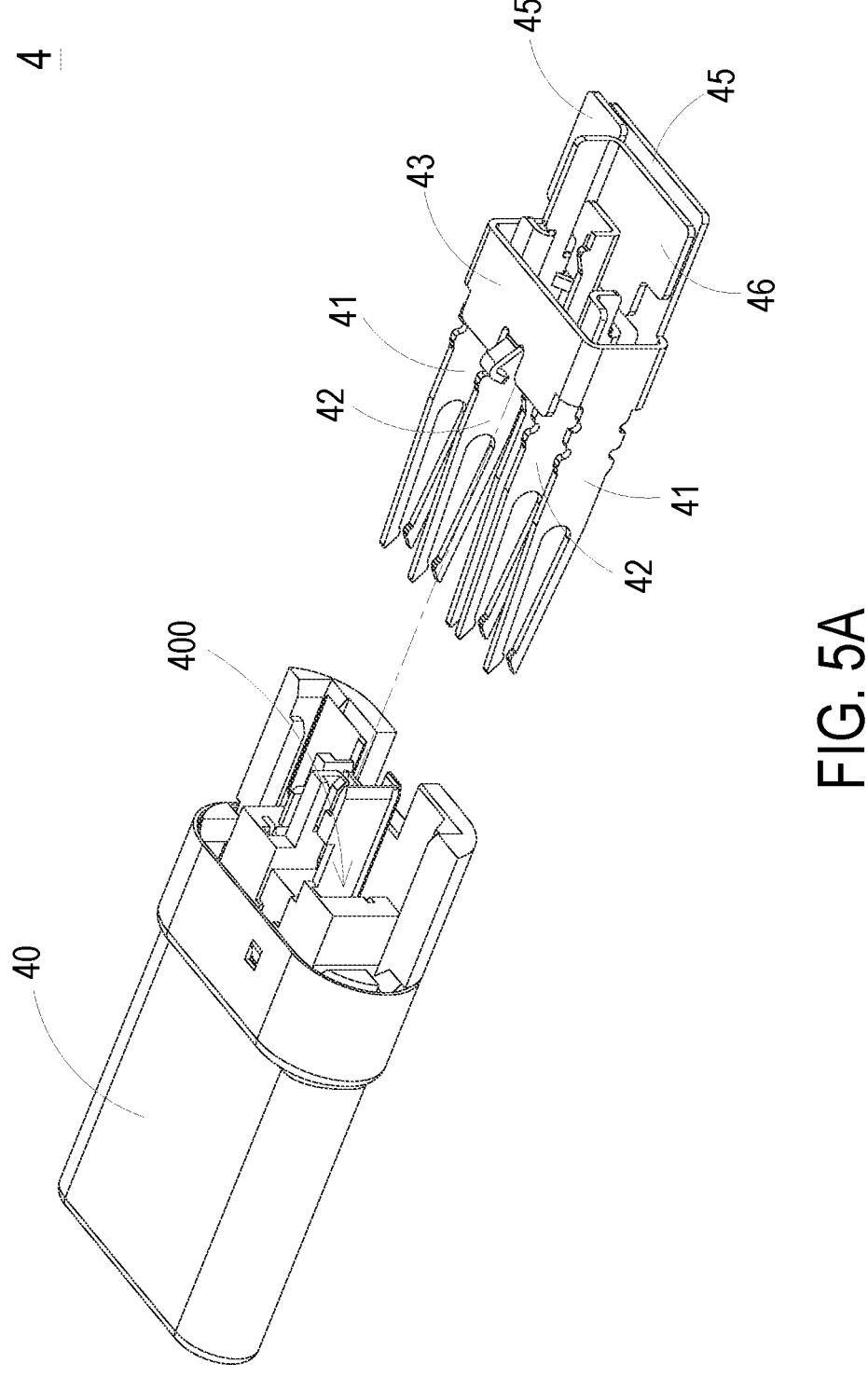
FIG. 5A is a schematic perspective view illustrating ground terminals and electrical terminals assembled with a casing of an electric connector according to a third embodiment of the present disclosure.
Figure 5B:
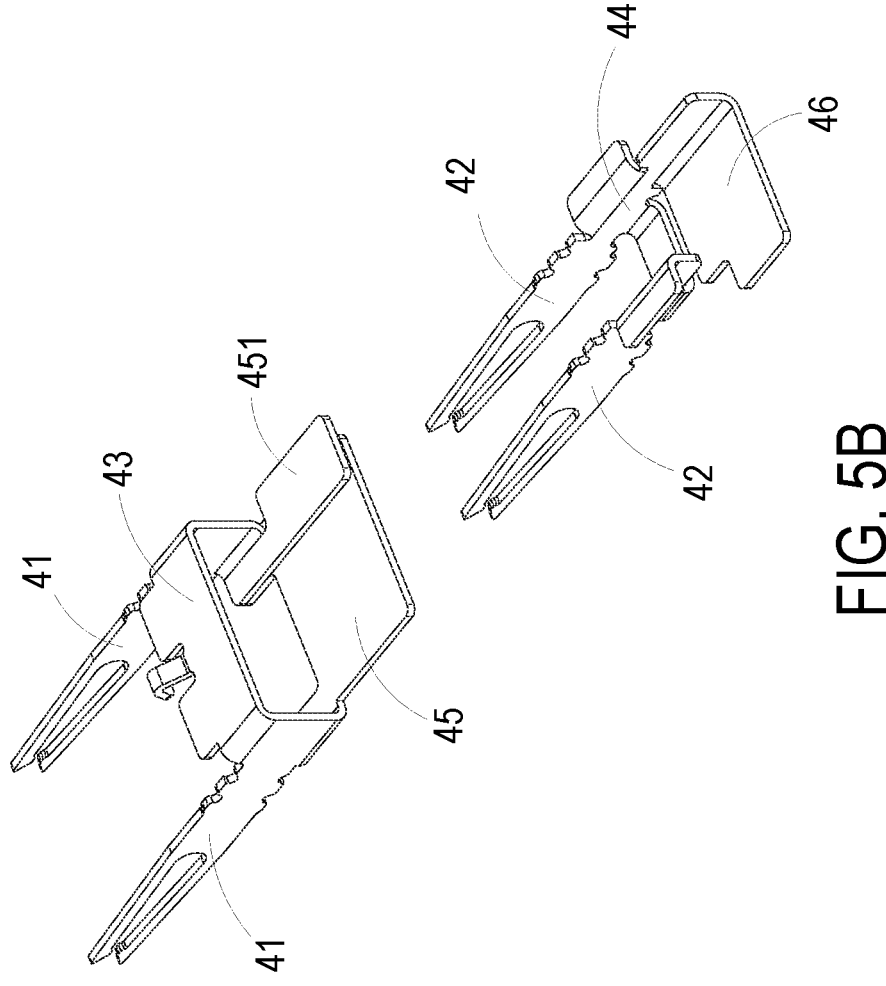
FIG. 5B is a schematic exploded view illustrating the ground terminals and the electrical terminals of FIG. 5A.

Please refer to FIG. 5A and FIG. 5B. FIG. 5A is a schematic perspective view illustrating ground terminals and electrical terminals assembled with a casing of an electric connector according to a third embodiment of the present disclosure. FIG. 5B is a schematic exploded view illustrating the ground terminals and the electrical terminals of FIG. 5A. Similar to the previous embodiment, the electric connector 4 of this embodiment also includes a casing 40, a plurality of ground terminals 41, a plurality of electrical terminals 42, a first connection portion 43 and a second connection portion 44, and the plurality of ground terminals 41 and the plurality of electrical terminals 42 are both arranged in the accommodating space 400 of the casing 40. Snice the structures and arrangements of the plurality of ground terminals 41, the plurality of electrical terminals 42, the first connection portion 43, and the second connection portion 44 are similar to the previous embodiment, which are not redundantly described herein. While in this embodiment, the number of the plurality of ground terminals 41 is two, and the first connection portion 43 is bent downward and extended to form a first extension part 45. The first extension part 45 is also a plate structure with bent steps, which has a relatively large width, and the width is close to the distance between the two ground terminals 41, but not limited thereto. Moreover, one side of the first connection portion 43 is bent downward to form another plate 451, the width of the plate 451 is less then the width of the first extension part 45, and a height difference is defined between the plate 451 and the first extension part 45. Namely, the height of the plate 451 is taller than the height of the first extension part 45. In this embodiment, the plate 451 is parallel to the first connection portion 43 and the first extension part 45, but not limited thereto. Furthermore, the second connection portion 44 extends rearward to form the second extension part 46. In this embodiment, the second extension part 46 is an L-shaped plate structure, but not limited thereto. Consequently, by the arrangement of the plate structure with bent steps of the first extension part 45 and the L-shaped plate structure of the second extension part 46, the idle space inside the electrical connector 4 can be effectively utilized to increase heat dissipation area, which is beneficial to reduce the temperature rise and increase the rated current value.

From the above descriptions, the present disclosure provides an electric connector, and the electric connector is a USB TYPE-C electric connector assembly for charging. The electric connector comprises a casing, a plurality of ground terminals, a plurality of electrical terminals, a first connection portion and a second connection portion, wherein the first connection portion connects to the plurality of ground terminals and is bent and extended to form a first extension part, and the second connection portion connects to the plurality of electrical terminals and extends a second extension part. One of the first extension part and the second extension part is a plate structure with bent steps. By the enlarge area and the arrangement of the plate structure with bent steps of the first extension part and the second extension part, the idle space inside the electrical connector can be effectively utilized to increase heat dissipation area, which is beneficial to reduce the temperature rise during charging and increase the rated current value, so that the charging current value and charging performance can be improved.

While the disclosure has been described in terms of what is presently considered to be the most practical and preferred embodiments, it is to be understood that the disclosure needs not be limited to the disclosed embodiment.

What is claimed is:

1. An electric connector, comprising:
a casing having an accommodating space;
a plurality of ground terminals arranging in the accommodating space;

a first connection portion connecting to the plurality of ground terminals and being bent and extended to form a first extension part;
a plurality of electrical terminals arranging in the accommodating space; and
a second connection portion connecting to the plurality of electrical terminals and extending a second extension part;
wherein the first extension part has a first vertical projection, the second extension part has a second vertical projection, the first vertical projection partially overlaps with the second vertical projection and defines an overlapping projection length, and one of the first extension part and the second extension part is a plate structure with bent steps.

2. The electric connector according to claim 1, wherein each the ground terminal and each the electrical terminal have free ends and rear ends, the first connection portion couples with the rear ends of the plurality of ground terminals, and the second connection portion couples with the rear ends of the plurality of electrical terminals.

3. The electric connector according to claim 1, wherein a width of the plate structure with bent steps is greater than ½ of width of the casing.

4. The electric connector according to claim 1, wherein the length of the overlapping projection length is between ¼ and ⅔ of width of the casing.

5. The electric connector according to claim 1, wherein a distance is defined between the first extension part or the second extension part and a top surface of the casing.

6. The electric connector according to claim 1, wherein a height difference is defined between the first extension part and the second extension part.

7. The electric connector according to claim 1, wherein one of the first extension part and the second extension part is the plate structure with bent steps, and the other second extension part or the first extension part comprises a first plate and a second plate.

8. The electric connector according to claim 7, wherein one of the first extension part and the second extension part is the plate structure with bent steps and comprises a third plate.

9. The electric connector according to claim 1, wherein one of the first extension part and the second extension part is an L-shaped plate structure.

* * * * *